US009853618B2

(12) United States Patent
Koizumi et al.

(10) Patent No.: US 9,853,618 B2
(45) Date of Patent: Dec. 26, 2017

(54) TRANSIMPEDANCE AMPLIFIER CIRCUIT

(71) Applicants: Nippon Telegraph and Telephone Corporation, Tokyo (JP); NTT Electronics Corporation, Kanagawa (JP)

(72) Inventors: Hiroshi Koizumi, Tokyo (JP); Masafumi Nogawa, Tokyo (JP); Masatoshi Tobayashi, Kanagawa (JP); Masahiro Endo, Kanagawa (JP)

(73) Assignees: NIPPON TELEGRAPH AND TELEPHONE CORPORATION, Tokyo (JP); NTT ELECTRONICS CORPORATION, Kanagawa (JP)

(*) Notice: Subject to any disclaimer, the term of this patent is extended or adjusted under 35 U.S.C. 154(b) by 0 days.

(21) Appl. No.: 15/030,375

(22) PCT Filed: Sep. 26, 2014

(86) PCT No.: PCT/JP2014/075634
§ 371 (c)(1),
(2) Date: Apr. 18, 2016

(87) PCT Pub. No.: WO2015/060066
PCT Pub. Date: Apr. 30, 2015

(65) Prior Publication Data
US 2016/0261246 A1 Sep. 8, 2016

(30) Foreign Application Priority Data
Oct. 25, 2013 (JP) .................... 2013-221963

(51) Int. Cl.
H03F 3/45 (2006.01)
H03G 3/30 (2006.01)
(Continued)

(52) U.S. Cl.
CPC .......... H03G 3/3084 (2013.01); H03F 3/082 (2013.01); H03F 3/087 (2013.01);
(Continued)

(58) Field of Classification Search
CPC ..................... H03F 3/08; H03F 3/45
(Continued)

(56) References Cited

U.S. PATENT DOCUMENTS 4,775,481 A * 10/1988 Allington .............. G01N 30/32
210/101
5,121,076 A 6/1992 Lendaro
(Continued)

FOREIGN PATENT DOCUMENTS

JP S62-029377 A 2/1987
JP H06-260866 A 9/1994
(Continued)

OTHER PUBLICATIONS

"10 Gbit/s Burst Mode Receiption IC Technology." NTT Technical Journal (Jan. 2011). pp. 31-35, with English translation of relevant portion(s).
(Continued)

Primary Examiner — Henry Choe
(74) Attorney, Agent, or Firm — Blakely Sokoloff Taylor & Zafman LLP

(57) ABSTRACT

A transimpedance amplifier circuit (1) includes an amplifier (22) that amplifies a received signal, an automatic gain control (AGC) circuit (2) that controls the amplification gain of the amplifier by a first time constant in accordance with the level of the received signal, and a first selection circuit (25) that selects the first time constant from a plurality of predetermined values. This can simultaneously implement a short time constant of an AGC function necessary to instantaneously respond to a burst signal and a long time constant of the AGC function necessary to obtain a satisfactory bit error rate (BER) characteristic in a continuous signal by an inexpensive and compact circuit arrangement.

12 Claims, 8 Drawing Sheets

(51) Int. Cl.
  *H04B 10/58* (2013.01)
  *H03F 3/08* (2006.01)
(52) U.S. Cl.
  CPC ..... *H03F 3/45179* (2013.01); *H03F 3/45475* (2013.01); *H03F 3/45744* (2013.01); *H03F 3/45968* (2013.01); *H03G 3/3052* (2013.01); *H04B 10/58* (2013.01); *H03F 2200/408* (2013.01); *H03F 2203/45142* (2013.01); *H03F 2203/45212* (2013.01); *H03F 2203/45288* (2013.01)
(58) Field of Classification Search
  USPC .......................................... 330/308, 254, 278
  See application file for complete search history.

(56) References Cited

U.S. PATENT DOCUMENTS

| | | | | |
|---|---|---|---|---|
| 8,629,935 | B2* | 1/2014 | Kikuchi | H04N 5/23241 348/241 |
| 8,798,567 | B2* | 8/2014 | Yoneyama | H03G 3/20 455/240.1 |
| 2008/0309407 | A1 | 12/2008 | Nakamura et al. | |
| 2011/0031419 | A1* | 2/2011 | Fukui | G08B 17/107 250/574 |

FOREIGN PATENT DOCUMENTS

| | | |
|---|---|---|
| JP | H08-051329 A | 2/1996 |
| JP | 2009-246535 A | 10/2009 |
| JP | 2009-278426 A | 11/2009 |
| JP | 2010-166216 A | 7/2010 |
| JP | 2010-213128 A | 9/2010 |
| WO | WO 2008/075430 A1 | 6/2008 |
| WO | WO 2010/082585 A1 | 7/2010 |

OTHER PUBLICATIONS

Transimpedance Amplifier for 10 Gbps Optical Communication, OKI Technical Review (Jan. 2001). pp. 110-113, with English translation of relevant portion(s).

Office Action in Chinese Application No. 201480057635.3 dated Sep. 29, 2017, with English translation.

* cited by examiner

TRANSIMPEDANCE AMPLIFIER CIRCUIT

TECHNICAL FIELD

The present invention relates to a transimpedance amplifier (TIA) circuit and, more particularly, to the automatic gain control function of a TIA circuit.

BACKGROUND ART

In an optical receiving device, an optical signal received by a photodiode (PD) is converted into a current signal, and further converted by a transimpedance amplifier (TIA) circuit into a voltage signal. FIG. 9 is a block diagram showing an example of the arrangement of a general TIA circuit. A TIA circuit 100 is a multistage amplifier circuit including amplifiers 22, 40, and 50. The TIA circuit 100 also includes an automatic gain control (AGC) circuit 200 that includes a gain control unit 21 and controls the gain of the amplifier 22 of the first stage. The gain control unit 21 controls a feedback resistor Rf of the amplifier 22 by a control voltage Vagc, and thus controls the gain of the amplifier 22 such that the amplitude of a signal output from the amplifier 22 maintains a predetermined value.

In optical communication, since the received light intensity changes depending on the communication distance, it is necessary to amplify any signals ranging from a weak (dark) optical signal to a strong (bright) optical signal while ensuring low noise and low distortion. For this purpose, a TIA circuit for optical communication often has a function of controlling the amplification gain in accordance with the magnitude of an input signal strength, that is, the magnitude of a received light intensity. The TIA circuit makes the gain large when the received light intensity is high, and makes the gain small when the received light intensity is low. An AGC circuit that automatically executes such gain control has been input into practical use in various architectures.

The AGC circuit controls the gain by a certain time constant. The function of determining an optimum gain and controlling it by the AGC circuit will be referred to as an "AGC function", and the time constant used by the AGC circuit when controlling the gain will be referred to as the "time constant of the AGC function" hereinafter.

In the arrangement example of FIG. 9, the time constant of the AGC function is decided by the magnitudes of a resistor Ragc and a capacitor Cagc of the AGC circuit 200. If the time constant of the AGC function is too short, following to a logic change in the input signal occurs, and therefore, it may be impossible to obtain a desired output. This is because, for example, if the gain is made small when the input signal is at High level, and the gain is made large at Low level, the output level at High level and the output level at Low level almost equal, and the output amplitude consequently becomes small. In general, considering the baud rate or encoding method of input data, the time constant of the AGC function is designed such that it attains a sufficient length to grasp the average input amplitude.

However, in a case in which intermittent optical signals (burst signals) are received in a PON (Passive Optical Network) system or the like, if the time constant of the AGC function is too long, correct reception cannot be performed until an optimum gain is set. For this reason, an enormous preamble signal needs to be included in a transmission frame, and as a result, the communication efficiency greatly lowers.

For example, in the standard of 10G-EPON standardized by IEEE802.3av, the burst response time should be 800 ns or less in total in a TIA circuit and a limiting amplifier of the subsequent stage. The TIA circuit preferably responds within about 400 ns. In a general TIA circuit for a continuous signal, however, the time is as long as several s to several ms.

Hence, for burst communication, the time constant of the AGC function is set relatively short, or switching between different fixed gains is done on a burst basis, thereby ensuring the response speed and the dynamic range as an amplifier circuit (for example, see non-patent literature 1).

However, it is difficult to simultaneously implement smooth gain control completely proportional to an input amplitude and a quick response. If the circuit lacks one of them, it causes degradation in a bit error rate (BER) characteristic representing the relationship between input optical power and a bit error amount. For this reason, in burst communication of a data rate more than 10 Gbps, a mechanism for relieving a predetermined amount of bit errors by a forward error correction (FEC) function is introduced.

As described above, conventionally, the time constant of the AGC function of a TIA circuit is fixed. Hence, a TIA circuit for continuous optical communication that sets a relatively long time constant of the AGC function cannot respond to a burst signal. If a TIA circuit that sets a relatively short time constant of the AGC function for burst communication is used for continuous optical communication, consecutive identical digits become long because of the encoding method. Particularly, the BER characteristic for input optical power in an error free near-field region degrades. To apply the TIA circuit for burst communication to a continuous signal, expensive signal processing such as FEC is needed. This is undesirable in a network, for example, Ethernet® that needs to build a system at low cost.

As a solution to this problem, a method of connecting a capacitive element or a resistive element as an external component to the outside of an IC chip on which a TIA circuit is integrated and controlling the time constant is considerable (for example, see non-patent literature 2). In this method, however, if there exist a plurality of portions to increase or decrease capacitors or resistors in the circuit, as many terminals (pads) used to connect external elements are needed. It is also necessary to ensure a space to mount external elements in an optical module on which the TIA chip is mounted.

RELATED ART LITERATURE

Non-Patent Literature

Non-Patent Literature 1: 10 Gbit/s Burst Mode Reception IC Technology, NTT Technical Journal, 2011, January, pp. 31-35

Non-Patent Literature 2: Transimpedance Amplifier for 10 Gbps Optical Communication, OKI Technical Review, 2001, January, pp. 110-113

DISCLOSURE OF INVENTION

Problem to be Solved by the Invention

It is an object of the present invention to simultaneously implement a short time constant of an AGC function necessary to instantaneously respond to a burst signal and a long time constant of the AGC function necessary to obtain a satisfactory BER characteristic in a continuous signal by an inexpensive and compact circuit arrangement.

Means of Solution to the Problem

In order to solve the above-described problem, a transimpedance amplifier circuit according to the present invention includes an amplifier that amplifies a received signal, an automatic gain control circuit that controls an amplification gain of the amplifier by a first time constant in accordance with a level of the received signal, and a first selection circuit that selects the first time constant from a plurality of predetermined values.

Effect of the Invention

According to the present invention, it is possible to simultaneously implement a short time constant necessary to instantaneously respond to a burst signal and a long time constant necessary to obtain a satisfactory BER characteristic in a continuous signal by an inexpensive and compact circuit arrangement.

BEST MODE FOR CARRYING OUT THE INVENTION

Figure 1:
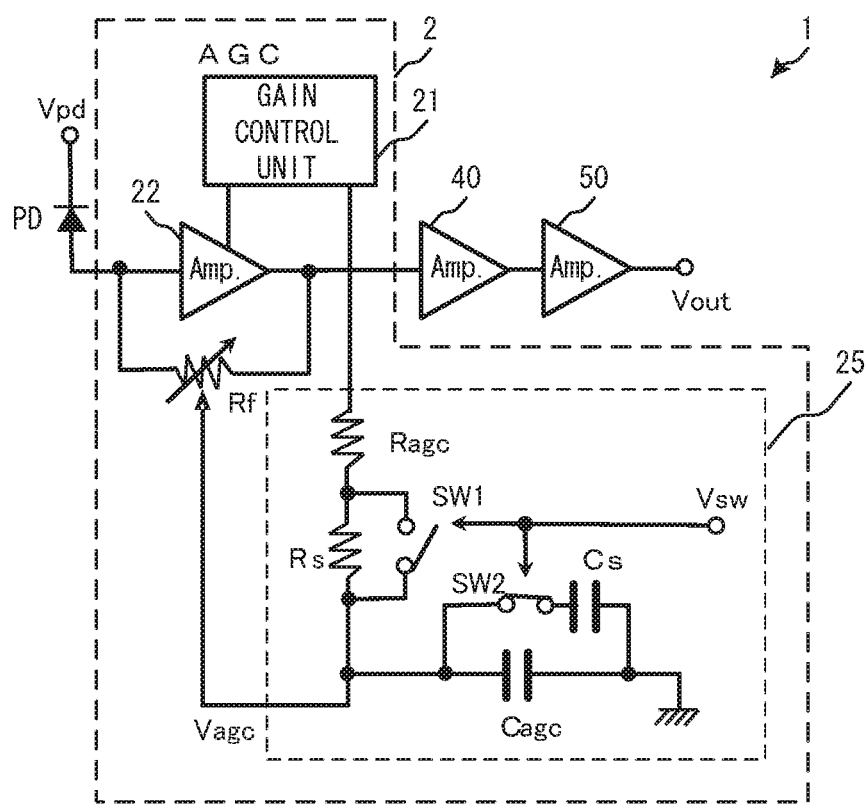
FIG. 1 is a block diagram showing an example of the arrangement of a TIA circuit according to the first embodiment of the present invention.

In the present invention, to implement a plurality of time constants of an AGC function, for example, at least one of the resistance value of a resistive element and the capacitance value of a capacitive element, which determine the value of a time constant of the AGC function, is changed based on a control signal.

More specifically, a first selection circuit that selects the time constant of the AGC function from a plurality of predetermined values can include a plurality of resistive elements or a plurality of capacitive elements included in the AGC circuit, and a switch element connected in series or parallel with at least some of the plurality of resistive elements or the plurality of capacitive elements and turned on or off based on the control signal to change one of the resistance value of the resistive element and the capacitance value of the capacitive element which determine the value of the time constant.

For example, a switch is placed for the resistive elements or the capacitive elements or at least some of both elements in the circuit which decide the time constant of the AGC function, and on/off-controlled to enable or disable the elements, thereby changing the resistance value or capacitance value.

For example, in a case in which the switch is connected in parallel with a resistive element or a capacitive element, if the switch is ON, the terminal of the element is set in a short-circuit state, and the element is disabled. If the switch is OFF, the short-circuit state changes to an open state, and the element is enabled. Alternatively, the switch may be connected in series with the element to connect the element to the circuit if the switch is ON and disconnect the element from the circuit if the switch is OFF. In addition, these arrangements may be combined. That is, the resistive element or capacitive element is enabled or disabled by switch control in the circuit, and the time constant of the AGC circuit can discretely be changed.

As the switch, for example, a MOS transistor can be used. The control signal is applied to the gate terminal of the MOS transistor. If the gate terminal of the MOS transistor is the input terminal of the switch control signal, the switch is turned on and set in the short-circuit state in a case in which a High level signal is input to the gate terminal of an NMOS transistor. In a case in which a Low level signal is input, the switch is set in the open state. A reverse applies to a PMOS transistor.

The control signal of the switch element may be a logic signal of two or more bits, and the switch element may switch the time constant of the AGC function between a plurality of predetermined discrete values in accordance with the value of the logic signal.

The TIA circuit may further include a received signal detection circuit that detects the received signal and outputs a first control signal if the continuous reception time of the received signal exceeds a predetermined time, and the first selection circuit may select, based on the first control signal, a longer time constant for the first time constant from two or more predetermined-values.

The received signal detection circuit may output a second control signal upon detecting a loss of the received signal, and the first selection circuit may select, based on the second control signal, a shorter time constant for the first time constant from two or more predetermined-values.

Figure 9:
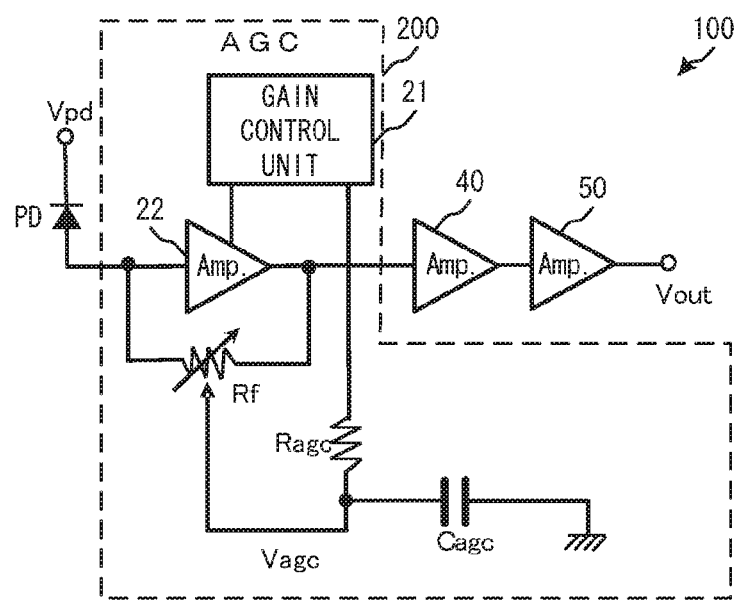
FIG. 9 is a block diagram showing an example of the arrangement of a conventional TIA circuit.

The embodiments of the present invention will now be described with reference to the accompanying drawings. Note that for the same constituent elements as in the related art shown in FIG. 9, the same names and the same reference numerals are used, and a description thereof will be omitted.

First Embodiment

The first embodiment of the present invention will be described with reference to FIG. 1. FIG. 1 shows an example of the arrangement of a TIA circuit that controls the time constants of an AGC circuit by one external terminal.

A TIA circuit 1 is a multistage amplifier circuit including amplifiers 22, 40, and 50. The TIA circuit 1 also includes an AGC circuit 2 that includes a gain control unit 21 and controls the gain of the amplifier 22 of the first stage. The gain control unit 21 controls a feedback resistor Rf of the amplifier 22 by a control voltage Vagc, and thus controls the gain of the amplifier 22 such that the amplitude of a signal output from the amplifier 22 maintains a predetermined value. That is, the AGC circuit 2 controls the gain of the amplifier 22 such that the amplitude of a signal output from the amplifier 22 maintains a predetermined value.

The AGC circuit 2 further includes resistors (Ragc and Rs), capacitors (Cagc and Cs), and switches SW1 and SW2. The additional resistor Rs is connected in series with the resistor Ragc. The switch SW1 is connected in parallel with the resistor Rs. The additional capacitor Cs is connected in parallel with the capacitor Cagc. The switch SW2 is connected in series with the capacitor Cs. The switches SW1 and SW2 are turned on/off by a switch control signal Vsw. The time constant of the AGC function of the TIA circuit 1 can be selected from a plurality of predetermined values obtained by turning on/off the switches SW1 and SW2 to combine the resistors (Ragc and Rs) and the capacitors (Cagc and Cs).

The resistors (Ragc and Rs), the capacitors (Cagc and Cs), and the switches SW1 and SW2 constitute a first selection circuit 25 that selects the time constant of the AGC function from the plurality of predetermined values.

In this embodiment, the polarities of the switches SW1 and SW2 are opposite to each other. For example, when the switch control signal Vsw is High, the switch SW1 is opened (OFF), and the switch SW2 is connected (ON). This logic may be reversed, as a matter of course.

Referring to FIG. 1, when the switch control signal Vsw is at High level, the resistor Rs connected in series with the resistor Ragc is enabled, and the capacitor Cs connected in parallel with the capacitor Cagc is enabled as well. At this time, a time constant Tagc_H of the AGC circuit is the product of the resistors (Ragc+Rs) and the capacitors (Cagc+Cs). On the other hand, when the switch control signal Vsw is at Low level, the resistor Rs short-circuits, and the capacitor Cs is disconnected. For this reason, a time constant Tagc_L of the AGC circuit is the product of the resistor Ragc and the capacitor Cagc. Hence, by changing the switch control signal Vsw to Low level, the time constant of the AGC circuit can be shortened as compared to a case in which the switch control signal Vsw is at High level.

The values of the resistors Ragc and Rs and the capacitors Cagc and Cs are appropriately designed, and the switch control signal Vsw is operated, thereby selecting one of the long time constant Tagc_H of the AGC circuit and the short time constant Tagc_L of the AGC circuit and discretely largely changing the time constant. If the long time constant Tagc_H is designed for a continuous optical signal, and the short time constant Tagc_L is designed for a burst optical signal, the time constants can discretely be switched by one control signal. Since the switch control signal Vsw can be of a DC level, it need only be pulled up to the power supply voltage in the continuous mode and pulled down to the ground level in the burst mode. The number of additional external terminals can be minimum, that is, one pin suffices.

<First Modification>

Figure 2:
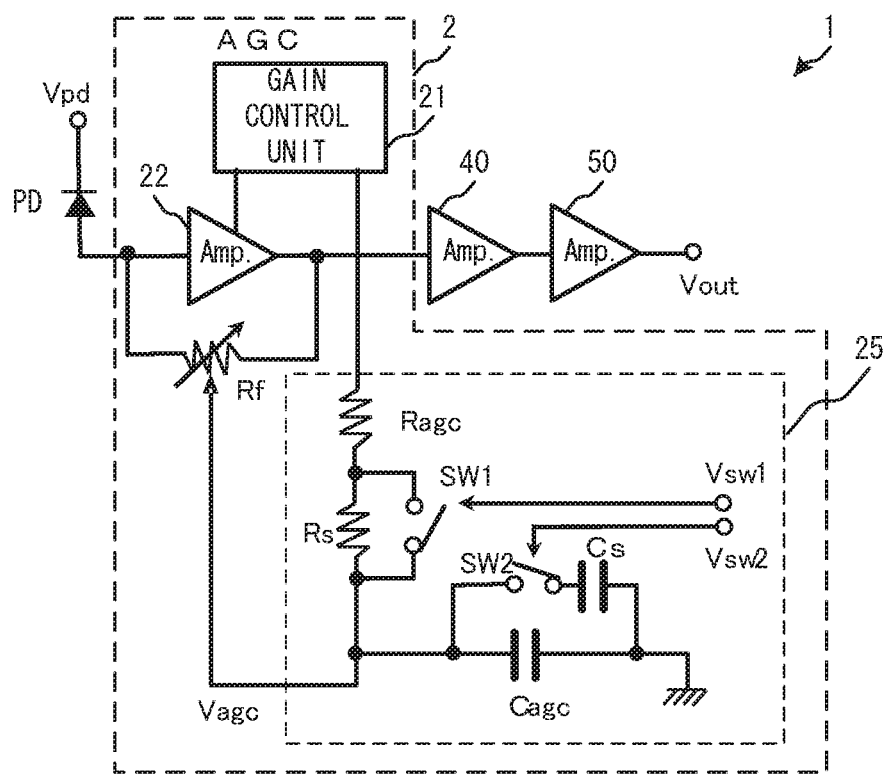
FIG. 2 is a block diagram showing another example of the arrangement of the TIA circuit according to the first embodiment.

An arrangement that complementarily switches the resistive elements and the capacitive elements using one control signal has been described with reference to FIG. 1. However, as shown in FIG. 2, the resistors and capacitors may individually be controlled in accordance with the designed time constant values. Alternatively, the time constants may be switched by controlling only the resistors or capacitors. This arrangement requires two external terminals. However, it is also possible to determine two or more discrete time constant values in advance and select a desired time constant in accordance with a time-rate change in a received optical signal, that is, whether a signal is a continuously received optical signal or an optical signal received at a burst. Hence, the time constant can be controlled more flexibly.

Figure 3:
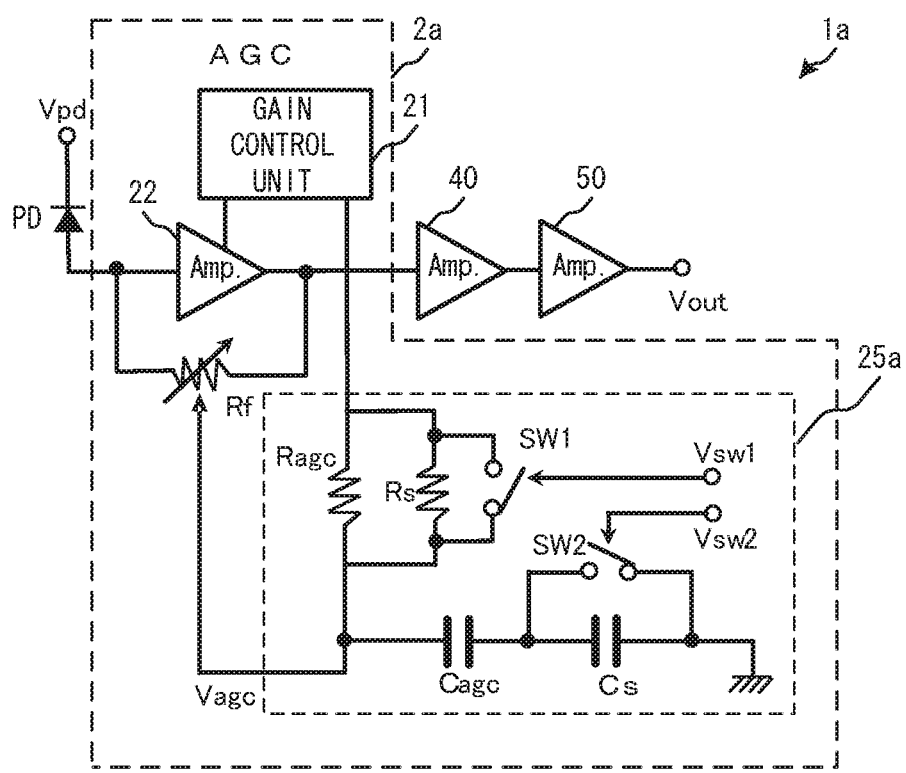
FIG. 3 is a block diagram showing a modification of the TIA circuit according to the first embodiment.

A description has been made with reference to FIGS. 1 and 2 based on arrangement examples in which the additional resistor Rs is connected in series with the resistor Ragc, and the additional capacitor Cs is connected in parallel with the capacitor Cagc. However, as shown in FIG. 3, a selection circuit 25a formed from the resistors (Ragc and Rs), the capacitors (Cagc and Cs), and the switches SW1 and SW2 in an AGC circuit 2a may have a circuit arrangement in which the additional resistive element Rs is connected in parallel, and the additional capacitive element Cs is connected in series.

As described above, in this embodiment, the resistance values of resistive elements or the capacitance values of capacitive elements that are constituent elements for determining a time constant are set in advance such that the time constant can take a discrete value, and the time constant is selected by tuning on/off the switch elements SW1 and SW2. The values and connection form of the elements are appropriately selected and decided in accordance with a desired time constant value. This also applies to the embodiments to be described below.

Second Embodiment

A TIA circuit according to the second embodiment of the present invention is an example of the arrangement of a TIA circuit that outputs a differential output.

In many cases, the output of a TIA circuit used in high-speed communication is preferably a differential output. Generally, since one photodiode outputs a single-phase signal, a mechanism (S2D: Single-to-Differential Converter) that changes the single-phase signal into a differential signal in the TIA circuit is needed to obtain a differential output. Hence, this embodiment is a more detailed embodiment of the TIA circuit.

In burst signal reception, the light intensities of burst signals do not always equal. For this reason, when changing a single-phase signal into a differential signal in the TIA circuit, the DC offset of the differential signal needs to be canceled. To do this, the TIA circuit is provided with an automatic offset control (AOC) circuit that automatically cancels the DC offset of the differential signal. The time constant of an AOC function by the AOC circuit needs to be shorter in burst signal reception as compared to a TIA circuit for a continuous optical signal, like the time constant of the AGC function.

However, like the AGC function, the time constant of the AOC function is fixed in a conventional TIA circuit. Hence, if an AOC circuit compatible with a burst signal is applied to continuous optical communication, the BER characteristic degrades depending on the encoding method. A TIA circuit having an AOC function with a long time constant for continuous optical communication cannot respond to a burst signal.

Hence, in the present invention, a TIA circuit including an amplifier that amplifies a received signal as described above, an AGC circuit that controls the amplification gain of the amplifier by a first time constant in accordance with the level of the received signal, and a first selection circuit that selects the first time constant from a plurality of predetermined values can further include an AOC circuit that outputs a differential signal based on the output of the amplifier and controls the offset amount of the differential signal by a second time constant, and a second selection circuit that selects the second time constant from a plurality of predetermined values.

Here, the second selection circuit can change at least one of the resistance value of a resistive element and the capacitance value of a capacitive element, which determine the value of the second time constant based on a control signal.

In addition, the second selection circuit can include a plurality of resistive elements or a plurality of capacitive elements included in the AOC circuit, and a second switch element connected in series or parallel with at least some of the plurality of resistive elements or the plurality of capacitive elements and turned on or off based on a control signal to change the resistance values of the resistive elements or the capacitance values of the capacitive elements, which determine the value of the second time constant.

The second switch element is, for example, a MOS transistor. The control signal is applied to the gate terminal of the MOS transistor.

In addition, the control signal of the second switch element may be a logic signal of two or more bits, and the second switch element may switch the second time constant between a plurality of predetermined discrete values in accordance with the value of the logic signal.

The TIA circuit may further include a received signal detection circuit that outputs a first control signal if the continuous reception time of the received signal exceeds a predetermined time, and the second selection circuit may be configured to select, based on the first control signal, a longer time constant for the second time constant from two or more predetermined-values.

The received signal detection circuit may output a second control signal upon detecting a loss of the received signal, and the second selection circuit may be configured to select, based on the second control signal, a shorter time constant for the second time constant from two or more predetermined-values.

In the TIA circuit according to the second embodiment, for example, a switch is placed for the resistive elements or the capacitive elements or at least some of both elements in the circuit which decide the time constant of an AOC function, and on/off-controlled to enable or disable the elements, thereby changing the resistance value or capacitance value and implementing a plurality of AOC functions, as in the above-described AGC circuit.

The second embodiment of the present invention will be described below with reference to FIG. 4.

Figure 4:
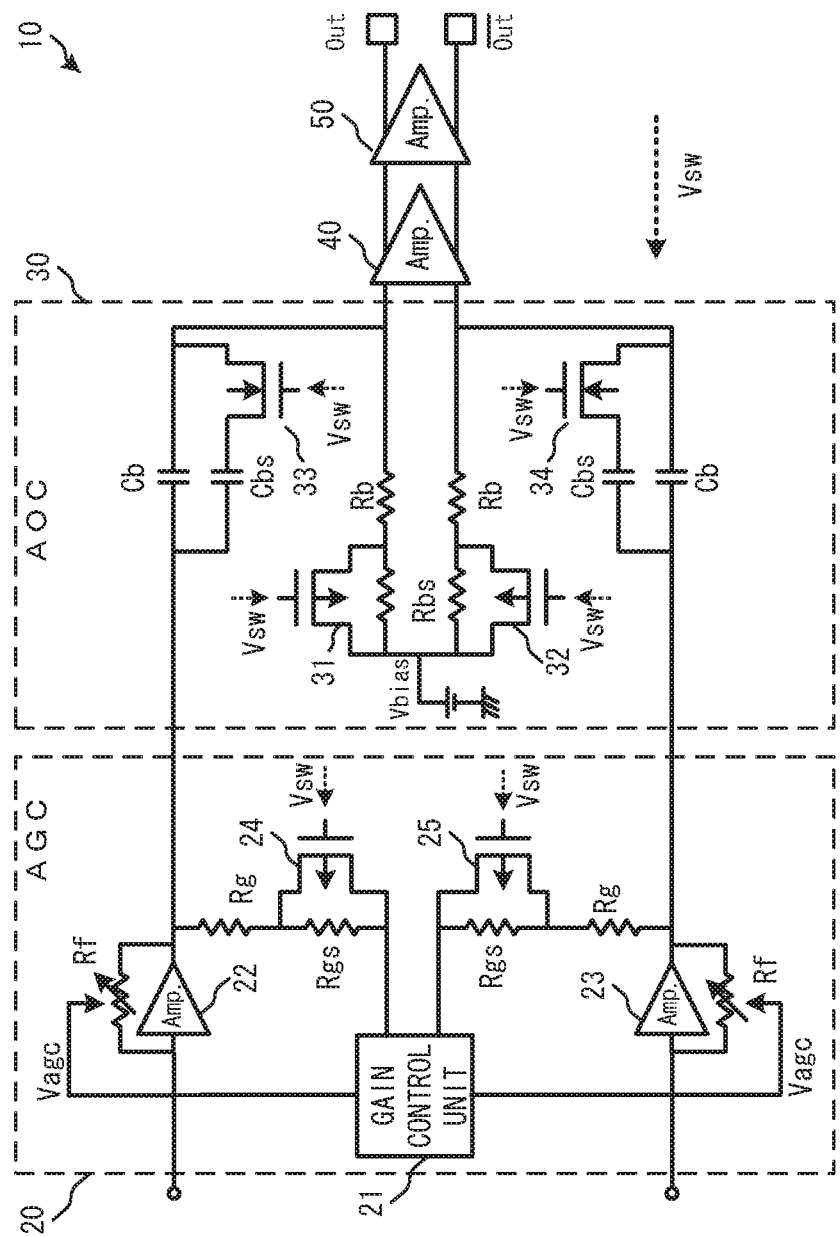
FIG. 4 is a block diagram showing an example of the arrangement of a TIA circuit according to the second embodiment.

FIG. 4 is a block diagram showing an example of the arrangement of a TIA circuit 10 that includes an AGC circuit 20 and an AOC circuit 30 and controls the time constant using a MOS transistor circuit serving as a switch element. As shown in FIG. 4, the TIA circuit according to this embodiment converts a single-phase input signal input from a photoelectric conversion element such as a photodiode (not shown) into a differential signal and outputs it. For this purpose, the TIA circuit 10 includes, as an amplifier of the first stage, a replica amplifier 23 identical to a first-stage input amplifier 22. The above-described single-phase input signal is input to the input terminal of the first-stage input amplifier 22, and the input terminal of the replica amplifier 23 is open. A gain control unit 21 of the AGC circuit 20 is shared by the two amplifier circuits. The outputs of the input amplifier 22 and the replica amplifier 23 are further differentially amplified by next-stage amplifiers 40 and 50 via the AOC circuit 30.

In this embodiment, the AOC circuit 30 is a circuit that AC-couples the outputs from the first-stage input amplifier 22 and the replica amplifier 23 by capacitors Cb, and makes DC levels match by a bias voltage Vbias via bias resistors Rb. In the AOC circuit according to this embodiment, an additional capacitor Cbs is connected in parallel with the capacitor Cb, an additional resistor Rbs is connected in series with the resistor Rb, NMOS transistors 33 and 34 are connected in series with the capacitors Cbs, and PMOS transistors 31 and 32 are connected in parallel with the resistors Rbs. Similarly, in the AGC circuit 20, additional resistors Rgs are connected in series with resistors Rg that decide the time constant, and PMOS transistors 24 and 25 are connected in parallel with the resistors Rgs.

Note that in the AGC circuit 20 shown in FIG. 4, the time constant of the AGC circuit 20 is controlled only by resistors. Even capacitors may be controlled in the same way as in the AOC circuit 30.

In this embodiment, a switch control signal Vsw described in the first embodiment is applied to the NMOS transistors 33 and 34 and the PMOS transistors 24, 25, 31, and 32 to on/off-control the MOS transistors. That is, when the switch control signal Vsw is at High level, the additional resistors and the additional capacitors are connected to the circuit, and the time constant thus becomes large. Hence, for an application purpose of receiving a continuous optical signal, the switch control signal Vsw is fixed to High level in advance. When the switch control signal Vsw is at Low level, the additional resistors and the additional capacitors are disconnected from the circuit, and the time constant thus becomes small. Hence, for an application purpose of receiving a burst optical signal, the switch control signal Vsw is fixed to Low level in advance.

As described above, according to the second embodiment of the present invention, a plurality of time constant decision elements in a plurality of circuits are enabled or disabled by only one control signal, thereby selecting one of a long time constant and a short time constant in each of the AGC circuit and the AOC circuit and discretely switching the time constants. Even in a case in which the time constant needs to be largely changed in, for example, burst optical communication or continuous optical communication, it is possible to appropriately design the resistance values and the capacitance values to values desirable for the user and easily set the time constant to a desired value.

<Second Modification>

Figure 5A:
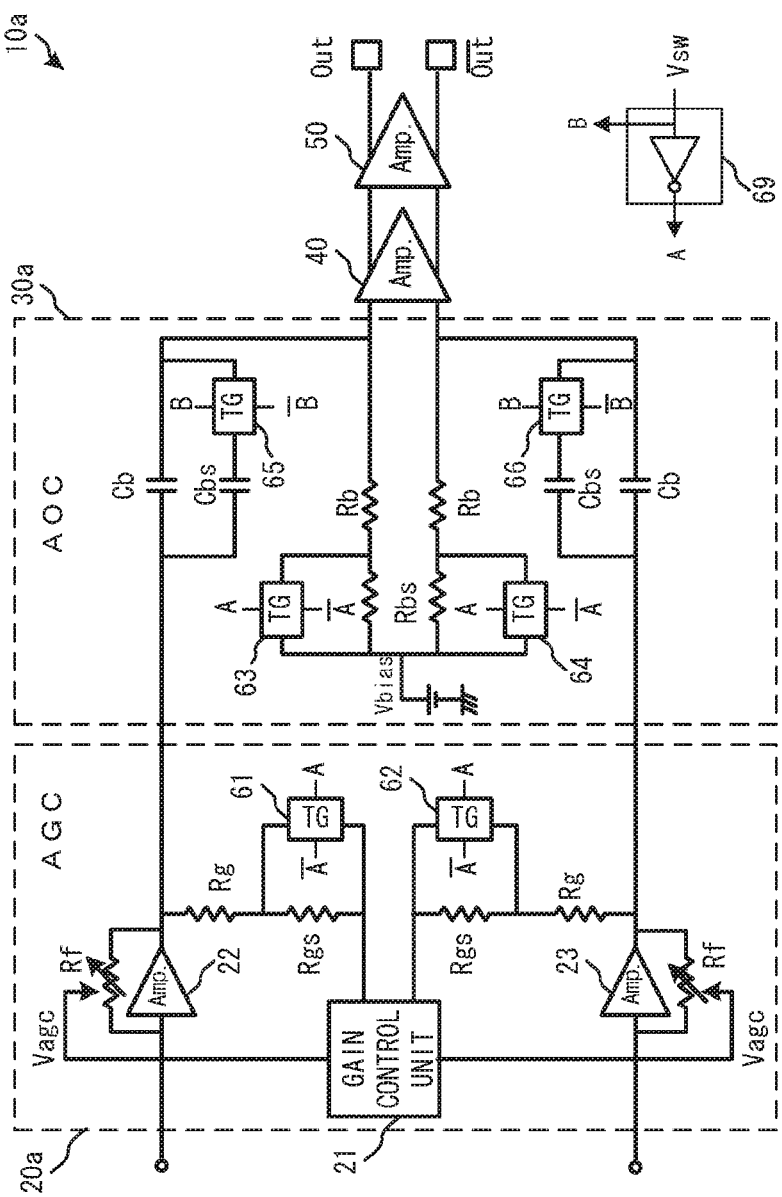
FIG. 5A is a block diagram showing a modification of the TIA circuit according to the second embodiment.
Figure 5B:
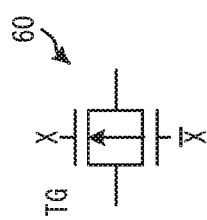
FIG. 5B is a view for explaining a transfer gate circuit.

In this embodiment, PMOS and NMOS transistors are used as the switch elements. However, so-called transfer gate (TG) circuits (60 to 66) each of which includes PMOS and NMOS transistors whose source and drain are connected to each other and is controlled by inputting complementary logic signals (X and X⁻) to the gates of the transistors, as shown in FIG. 5B, may be used as the switch elements. In this case, as shown in FIG. 5A, the switches 61 and 62 connected in parallel with the pair of additional resistive elements Rgs in an AGC circuit 20a, and the switches 63 and 64 connected in parallel with the pair of additional resistive elements Rbs and the switches 65 and 66 connected in series with the pair of additional capacitive elements Cbs in an AOC circuit 30a are formed from the TG circuits 60. A control signal input circuit 69 controls such that the polarities of input control signals A and B become opposite to each other.

Third Embodiment

The third embodiment of the present invention will be described with reference to FIGS. 6, 7A, and 7B.

Figure 6:
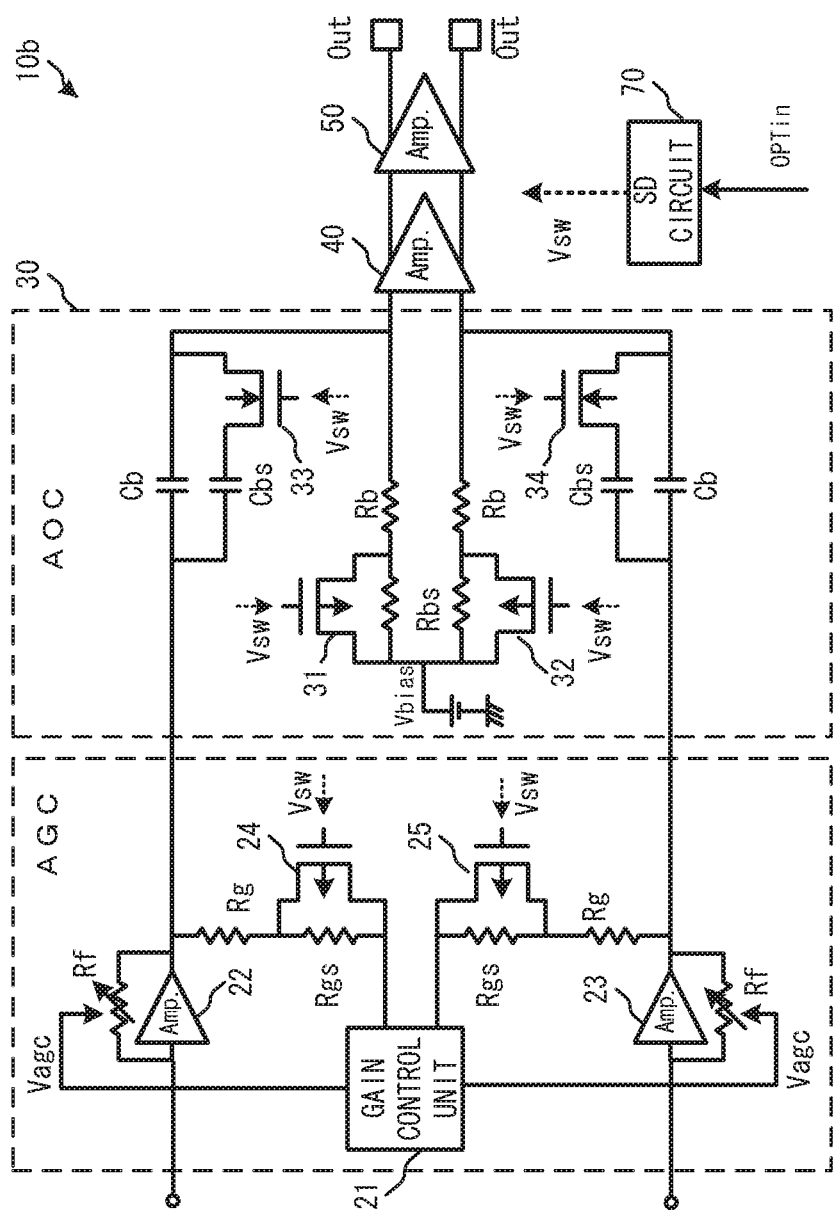
FIG. 6 is a block diagram showing an example of the arrangement of a TIA circuit according to the third embodiment.

FIG. 6 shows an example of the arrangement of a TIA circuit 10b that determines the presence/absence of optical signal input using a signal detection (SD) circuit 70 and automatically discriminates, based on the determination result, which one of long and short time constants should be set. FIGS. 7A and 7B show examples of the arrangement of the SD circuit 70.

In continuous optical signal communication, an optical signal having a predetermined optical power or more is always continuously received. On the other hand, in burst optical communication, optical signal input is intermittent. Hence, the TIA circuit 10b according to this embodiment is provided with the SD circuit 70 that determines the presence/absence of an optical signal input OPTin and, based on the determination result, outputs a High or Low logic level signal. In this embodiment, according to the polarity of a switch control signal Vsw described above, the SD circuit 70 outputs High level if optical reception continues for a predetermined time Tc or more. On the other hand, if optical signal reception does not continue for the predetermined time or more, and the SD circuit 70 detects a loss of the received signal, the SD circuit 70 maintains a Low level output. Unless the optical signal continuously received continues for the predetermined time Tc or more, the SD circuit 70 does not output High level. Hence, the High level output of the SD circuit 70 represents "presence of an optical signal", and the Low level output represents "absence of an optical signal". In a default state (upon powering on the circuit), the output of the SD circuit 70 is Low. The polarities of the logics are design items and are appropriately selected.

Figure 7:
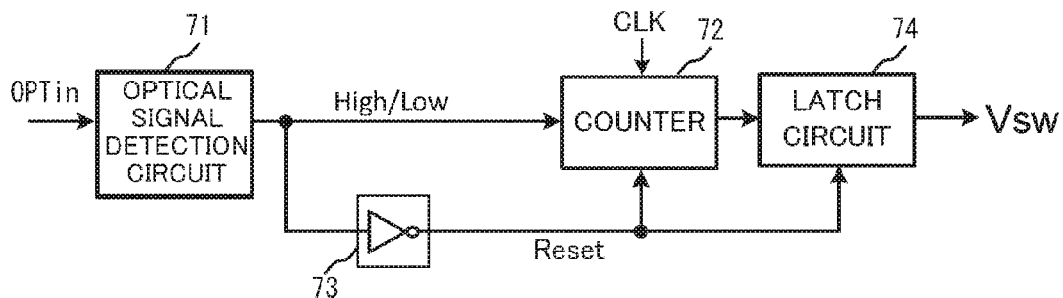
FIG. 7A is a block diagram showing an example of the arrangement of a signal detection circuit provided in the TIA circuit according to the third embodiment.
FIG. 7B is a block diagram showing an example of the arrangement of a signal detection circuit provided in the TIA circuit according to the third embodiment.
Figure 7:
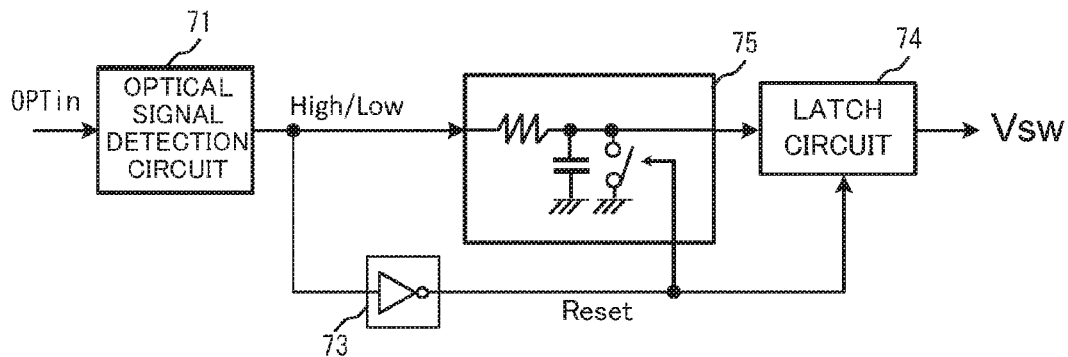

Such a logic circuit can be formed from a counter 72, a reset circuit 73, a latch circuit 74, and the like, as shown in FIG. 7A. That is, during reception of an optical signal, the counter 72 counts a clock signal (CLK). If the optical signal reception time is equal to or more than a predetermined count, the latch circuit 74 switches the output to High level and holds it. On the other hand, if a photodetection circuit 71 detects a loss of the optical signal, the reset circuit 73 outputs a reset signal based on the Low level output of the SD circuit 70 to reset the counter 72 and the latch circuit 74, and Low level is output as the switch control signal Vsw.

Note that the counter 72 is not limited to a digital circuit (FIG. 7A) using a clock signal, and may be an analog holding circuit 75 using charging and discharging of a capacitor, as shown in FIG. 7B.

The predetermined time Tc is preferably equal to or more than the maximum value of a burst packet. That is, when the predetermined time Tc is set to be equal to or more than the time length of the longest burst packet, the SD circuit has no opportunity to output High level after power-on and maintains Low level. When this output is used as Vsw, the time constant of the AGC function and the time constant of the AOC function in the TIA circuit are continuously set short for burst communication. To the contrary, in continuous optical signal reception, since the output of the SD circuit changes to High level after the predetermined time Tc, the time constant is set long for continuous communication. Note that a means for forcibly fixing the value of Vsw to High or Low may be provided.

According to this embodiment, external terminals for time constant setting are unnecessary. In addition, since it is automatically discriminated whether an input signal is a continuous optical signal or a burst optical signal, optical packages of identical implementations are usable for a continuous optical signal and a burst optical signal. This is easy to use and effective for cost reduction.

According to this embodiment, it is possible to more effectively use the feature of the present invention, that is, implementing time constant switching by a switch in an integrated circuit.

Fourth Embodiment

Figure 8:
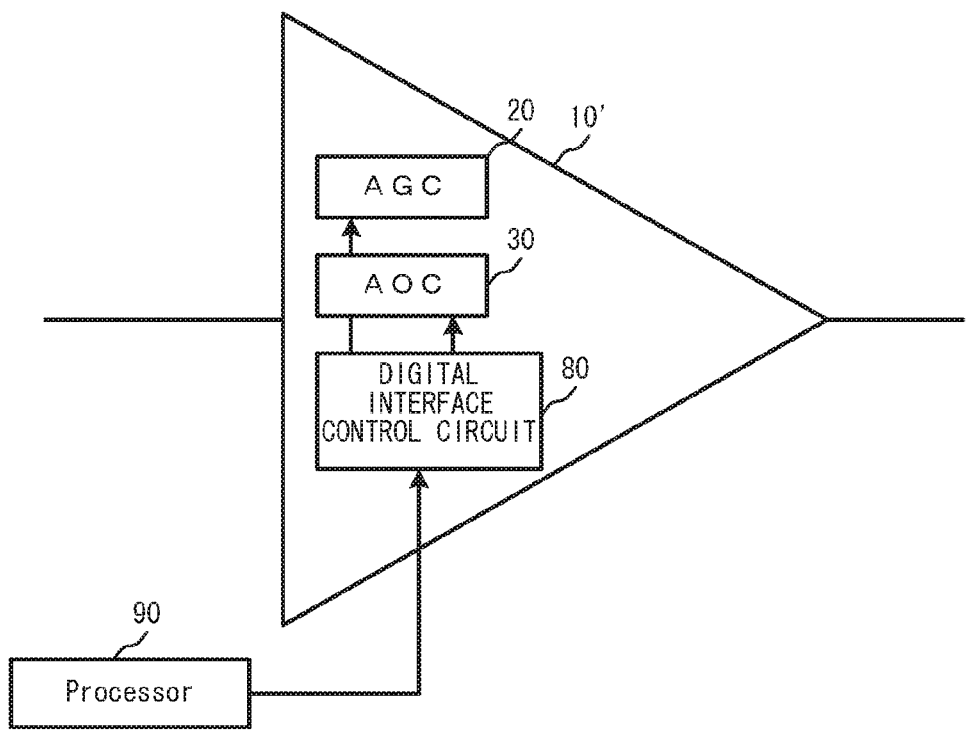
FIG. 8 is a block diagram showing an example of the arrangement of a TIA circuit according to the fourth embodiment.

The fourth embodiment of the present invention will be described with reference to FIG. 8. In the second and third embodiments, at least the time constant setting is done using two values representing long and short time constants, and both the AGC function and the AOC function are set at once. In this embodiment, the time constant can be set more finely using two or more values by controlling a switch integrated in an integrated circuit. That is, in this embodiment, a logic signal of two or more bits is used as the control signal for the first switch element in an AGC circuit and the second switch element in an AOC circuit. According to the value of the logic signal, the first and second switch elements switch the first time constant, that is, the time constant of the AGC function and the second time constant, that is, the time constant of the AOC function to one of a plurality of predetermined discrete values. The value of the time constant may be selected from a plurality of, that is, two or more levels, or may be set to different values for the AGC function and the AOC function.

To implement such control, at least 2-bit information needs to be transmitted into the circuit to set the plurality of time constants. For example, use of a general-purpose interface such as I2C (I Square C) or SPI (Serial Peripheral Interface) can be considered. A time constant set value is written for a control processor 90 such as a CPU or a microcomputer to a register in a TIA circuit 10'. In place of the control processor 90, a memory that stores the set value in advance may be connected, and the TIA circuit 10' may download the value stored in the memory and store it in the register of its own. A digital interface control circuit 80 outputs a switch control signal according to the stored value, and sets a time constant in each of an AGC circuit 20 and an AOC circuit 30. When an I2C interface is used, two control pins SCL (serial clock) and SDA (serial data) are necessary. However, there is an advantage of enabling various kinds of complex control.

As described above, the present invention provides a means for discretely switching the time constants of an AGC circuit and an AOC circuit, which decide the response time of a TIA circuit by controlling a switch mounted in the circuit, thereby easily and inexpensively implementing a TIA circuit compatible with both burst signal communication that needs a short time constant and continuous signal communication for which a long time constant is desirable.

Generally in a communication topology, a one-to-many branch configuration is frequently used, as represented by a PON (Passive Optical Network) system, and reception response times necessary in nodes may be different. When the present invention is used, the response time constants in a single integrated circuit can be optimized for the respective nodes. It is therefore possible to apply identical IC chips to broad application purposes. The cost of IC chips is almost inversely proportional to the number of shipped chips. Hence, if the chips are applicable to multiple purposes, the component cost, the device cost, and the system cost can be reduced.

INDUSTRIAL APPLICABILITY

The present invention is usable for a receiving circuit in an optical communication system that needs to be compatible with burst signal communication in which the strength or timing of a received optical signal largely changes and continuous signal communication in which an optical signal is continuously received.

EXPLANATION OF THE REFERENCE NUMERALS AND SIGNS 1, 10 . . . TIA circuit, 2, 20 . . . AGC circuit, 21 . . . gain control unit, 22, 23 . . . amplifier, 24, . . . PMOS transistor, 30 . . . AOC circuit, 31, 32 . . . PMOS transistor, 33, 34 . . . NMOS transistor, 40 . . . amplifier, 50 . . . amplifier, 60-66 . . . TG circuit, 70 . . . SD circuit, 71 . . . optical signal detection circuit, 72 . . . counter, 73 . . . reset circuit, 74 . . . latch circuit, 75 . . . analog holding circuit, 80 . . . digital interface control circuit, 90 . . . control processor, memory

The invention claimed is:

1. A transimpedance amplifier circuit comprising:
an amplifier that amplifies a received signal;
an automatic gain control circuit that controls an amplification gain of the amplifier by a first time constant in accordance with a level of the received signal; and
a first selection circuit that selects the first time constant from a plurality of predetermined values,
wherein the first selection circuit includes:
a plurality of resistive elements or a plurality of capacitive elements included in the automatic gain control circuit; and
a first switch element connected in series or parallel with at least some of the plurality of resistive elements or the plurality of capacitive elements and turned on or off based on the control signal to change one of the resistance value of the resistive element and the capacitance value of the capacitive element which decide the value of the first time constant.

2. The transimpedance amplifier circuit according to claim 1, wherein the first switch element comprises a MOS transistor, and
the control signal is applied to a gate terminal of the MOS transistor.

3. The transimpedance amplifier circuit according to claim 1, wherein the control signal of the first switch element is a logic signal of at least 2 bits, and
the first switch element switches the first time constant between a plurality of predetermined discrete values in accordance with a value of the logic signal.

4. A transimpedance amplifier circuit comprising:
an amplifier that amplifies a received signal;
an automatic gain control circuit that controls an amplification gain of the amplifier by a first time constant in accordance with a level of the received signal; and
a first selection circuit that selects the first time constant from a plurality of predetermined values, further comprising:
a received signal detection circuit that detects the received signal and outputs a first control signal when a continuous reception time of the received signal exceeds a predetermined time,
wherein the first selection circuit selects, based on the first control signal, a longer time constant for the first time constant from at least two predetermined-values.

5. The transimpedance amplifier circuit according to claim 4, wherein the received signal detection circuit outputs a second control signal upon detecting a loss of the received signal, and
the first selection circuit selects, based on the second control signal, a shorter time constant for the first time constant from at least two predetermined-values.

6. A transimpedance amplifier circuit comprising:
an amplifier that amplifies a received signal;
an automatic gain control circuit that controls an amplification gain of the amplifier by a first time constant in accordance with a level of the received signal; and
a first selection circuit that selects the first time constant from a plurality of predetermined values, further comprising:
an automatic offset control circuit that outputs a differential signal based on an output of the amplifier and controls an offset amount of the differential signal by a second time constant; and
a second selection circuit that selects the second time constant from a plurality of predetermined values.

7. The transimpedance amplifier circuit according to claim 6, wherein the second selection circuit changes, based on a control signal, at least one of a resistance value of a resistive element and a capacitance value of a capacitive element which decide a value of the second time constant.

8. The transimpedance amplifier circuit according to claim 6, wherein the second selection circuit includes:
a plurality of resistive elements or a plurality of capacitive elements included in the automatic offset control circuit; and
a second switch element connected in series or parallel with at least some of the plurality of resistive elements or the plurality of capacitive elements and turned on or off based on the control signal to change one of the resistance value of the resistive element and the capacitance value of the capacitive element which decide the value of the second time constant.

9. The transimpedance amplifier circuit according to claim 8, wherein the second switch element comprises a MOS transistor, and
the control signal is applied to a gate terminal of the MOS transistor.

10. The transimpedance amplifier circuit according to claim 8, wherein the control signal of the second switch element is a logic signal of at least 2 bits, and
the second switch element switches the second time constant between a plurality of predetermined discrete values in accordance with a value of the logic signal.

11. The transimpedance amplifier circuit according to claim 6, further comprising a received signal detection circuit that detects the received signal and outputs a first control signal when a continuous reception time of the received signal exceeds a predetermined time,
wherein the second selection circuit selects, based on the first control signal, a longer time constant for the second time constant from at least two predetermined-values.

12. The transimpedance amplifier circuit according to claim 11, wherein the received signal detection circuit outputs a second control signal upon detecting a loss of the received signal, and
the second selection circuit selects, based on the second control signal, a shorter time constant for the second time constant from at least two predetermined-values.

* * * * *